United States Patent [19]

Cox

[11] Patent Number: 4,602,337
[45] Date of Patent: Jul. 22, 1986

[54] ANALOG SIGNAL TRANSLATING SYSTEM WITH AUTOMATIC FREQUENCY SELECTIVE SIGNAL GAIN ADJUSTMENT

[76] Inventor: James R. Cox, 1001 Copperfield Ct., Louisville, Ky. 40207

[21] Appl. No.: 469,287

[22] Filed: Feb. 24, 1983

[51] Int. Cl.⁴ .................... G06F 15/20; G06G 7/62; H03G 5/00; H04R 27/00

[52] U.S. Cl. .................................... 364/480; 381/98; 381/83

[58] Field of Search ....................... 333/18, 28 R, 178; 364/480; 381/103, 66, 59, 83, 98; 73/579; 375/14

[56] References Cited

U.S. PATENT DOCUMENTS

| | | | |
|---|---|---|---|
| 3,949,325 | 4/1976 | Berkovitz | 381/103 |
| 4,079,199 | 3/1978 | Patronis, Jr. | 381/83 |
| 4,088,834 | 5/1978 | Thurmond | 381/83 |
| 4,088,835 | 5/1978 | Thurmond et al. | 381/83 |
| 4,276,604 | 6/1981 | Kitamura et al. | 381/480 |
| 4,316,060 | 2/1982 | Adams et al. | 381/98 |

Primary Examiner—John W. Caldwell, Sr.
Assistant Examiner—Donna L. Angotti
Attorney, Agent, or Firm—Francis H. Boos

[57] ABSTRACT

An automatic equalizer and oscillation suppressor system utilizing phase lock loop circuits to detect oscillation candidates at identified frequencies and a low cost microprocessor to process corrective band gain action. Oscillation candidates are initially suppressed by incremental adjustment of band gains to a maximum point after which notch filters are assigned to the oscillating frequency and the band gain returned to its normal equalized value. Automatic equalization is achieved initially with a pink noise source and on an on-going real time basis with program content by use of a frequency addressable narrow band boost circuit which is selectively inserted at frequencies across the bandwidth and band gains adjusted until some oscillation has occurred in all bands or maximum master gain has been reached.

5 Claims, 12 Drawing Figures

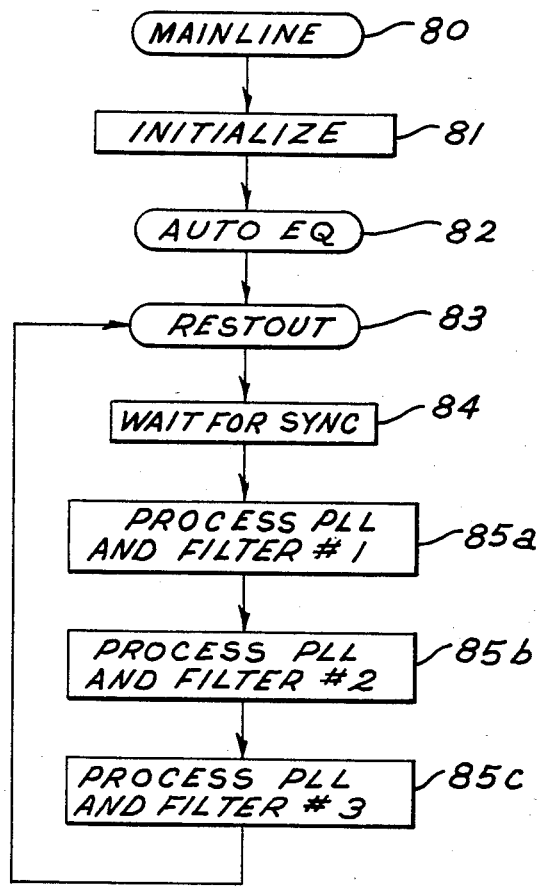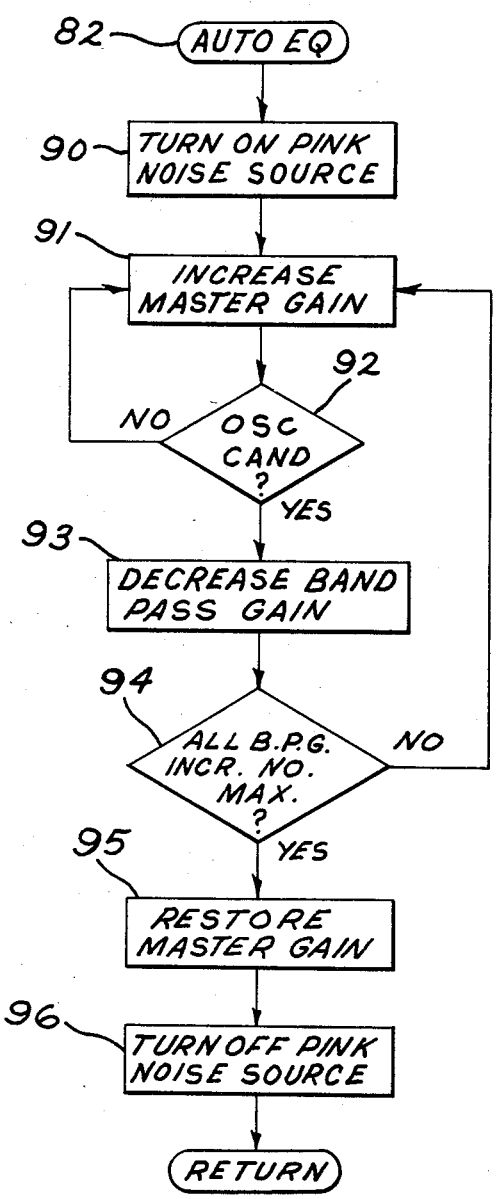

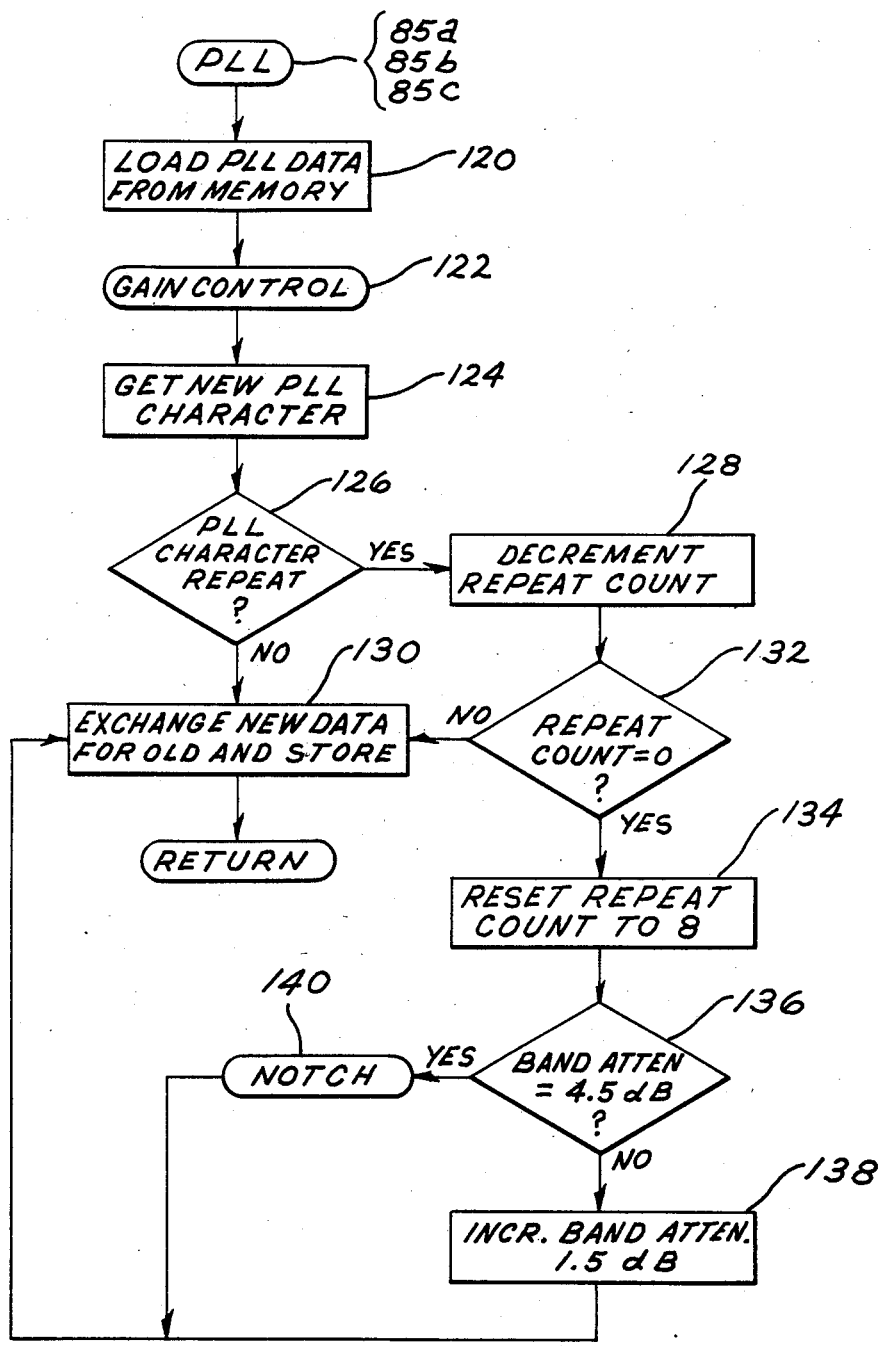

ANALOG SIGNAL TRANSLATING SYSTEM WITH AUTOMATIC FREQUENCY SELECTIVE SIGNAL GAIN ADJUSTMENT

BACKGROUND OF THE INVENTION

The present invention is directed to an automatically controlled signal translating system, such as an audio amplifier for a sound reinforcement system, that utilizes relatively inexpensive microprocessor techniques to control the gain of the signal translating system on a frequency selective basis to suppress positive feedback induced oscillation and/or to equalize the bandwidth response of the system. While described in connection with a sound reinforcement system, it will become apparent that the invention has use in other signal translating systems in which feedback would occur or in which nonuniform bandwidth response is a problem It is well known that sound reinforcement systems typically suffer from instability due to acoustical feedback of the amplified sound through the microphone input. Changes in sound absorption of materials in the surrounding environment and movement of the microphone can have an adverse effect on stability of the sound reinforcement system even if no initial instability is encountered. The method most often used to control the occurrence of acoustic feedback is to smooth room response with an equalizer circuit usually inserted between the microphone and the power amplifier. By appropriate adjustment of the equalizer across the frequency spectrum, a smooth response characteristic can be achieved that minimizes the potential for oscillations to occur at any frequency in the spectrum. However, as noted, transient changes in the environment, such as movement of spectators or movement of the microphone, can disrupt the response characteristic and cause oscillations unless the equalizer is constantly attended to compensate for the changes.

While attempts have been made to provide systems that will automatically suppress feedback induced oscillations in systems of the type described, they have generally proven to be ineffective for the purpose or, in the case of computer based systems, to require high powered, costly computers to operate effectively which makes such systems impractical for commerical applications.

It is therefore an object of the present invention to provide an economical and effective oscillation suppressor and automatic equalizer for a signal translating system, such as a sound reinforcement system, that is effective to detect and suppress oscillations before they reach the stage at which they become irritatingly noticeable and, in most cases, before they become audible at all.

SUMMARY OF THE INVENTION

Thus, in accordance with the invention, there is provided an analog signal translating system with automatic frequency selective signal gain adjustment. The system includes input means for supplying an input analog signal and an analog signal processing channel coupled to said input means and adapted to have a predetermined combined bandwidth. The signal processing channel also includes a plurality of individual signal channels coupled in parallel to said input means, at least one of the individual signal channels having a bandpass filter and a digital controlled amplifier connected in series, the bandwidth of the individual channel being less than the combined bandwidth of the signal processing channel. The system of the invention further includes output circuit means coupled to the individual signal channels for supplying the combined bandwidth analog signal to an output utilization circuit. Means, including a phase lock loop circuit, is coupled to the one individual signal channel for generating a substantially constant amplitude output signal indicative of the occurrence of a potential oscillation at a frequency within the band of the individual signal channel. When more than one individual signal channel is provided with a serially connected bandpass filter and digital controlled amplifier, a corresponding plurality of phase lock loop circuits are preferably each coupled to one of the individual signal channels and preferably, in all cases, the phase lock loop circuits are connected to the outputs of the bandpass filter circuits.

In accordance with a feature of the invention, means are provided for periodically sampling the output of the phase lock loop circuit and for converting the amplitude of each sample to a digital numeric value signal. Preprogrammed microprocessor means is coupled to the sampling means to provide, in response to the occurrence of a predetermined number of successive digital signals of substantially constant value from the sampling means, an output indicating the potential presence of an oscillation at a frequency within the bandwidth of the individual signal channel whose phase lock loop circuit is being sampled. Finally, the system of the invention includes means responsive to the first output of the microprocessor to attenuate the gain of the digital controlled amplifier in the individual channel by a predetermined amount so as to reduce the potential for oscillation at the detected frequency within the individual signal channel.

BRIEF DESCRIPTION OF THE DRAWINGS

FIGS. 6–11 are functional program flowcharts illustrating the manner in which programmers can establish programs useful for operation of the microprocessor of FIG. 1 in accordance with the present invention, in which:

FIG. 6 is the main program routine useful in the present invention;

FIG. 7 is a subroutine used to equalize the system bandpass characteristic;

FIG. 8 is the phase lock loop output sampling subroutine;

FIG. 9 is a subroutine used to monitor temporary deviations in gain of bandpass channels 16a/17a-16c/17c to allow for suppression of transient oscillatory conditions;

FIG. 10 is a subroutine used to insert notch attenuation in situations where maximum bandpass attenuation is unable to suppress oscillatory outputs; and FIG. 11 is a subroutine used to avoid erroneous interpretations of a phase lock loop output operating at normal rest frequency in the absence of a program signal as being an oscillation event.

DETAILED DESCRIPTION

Figure 1:
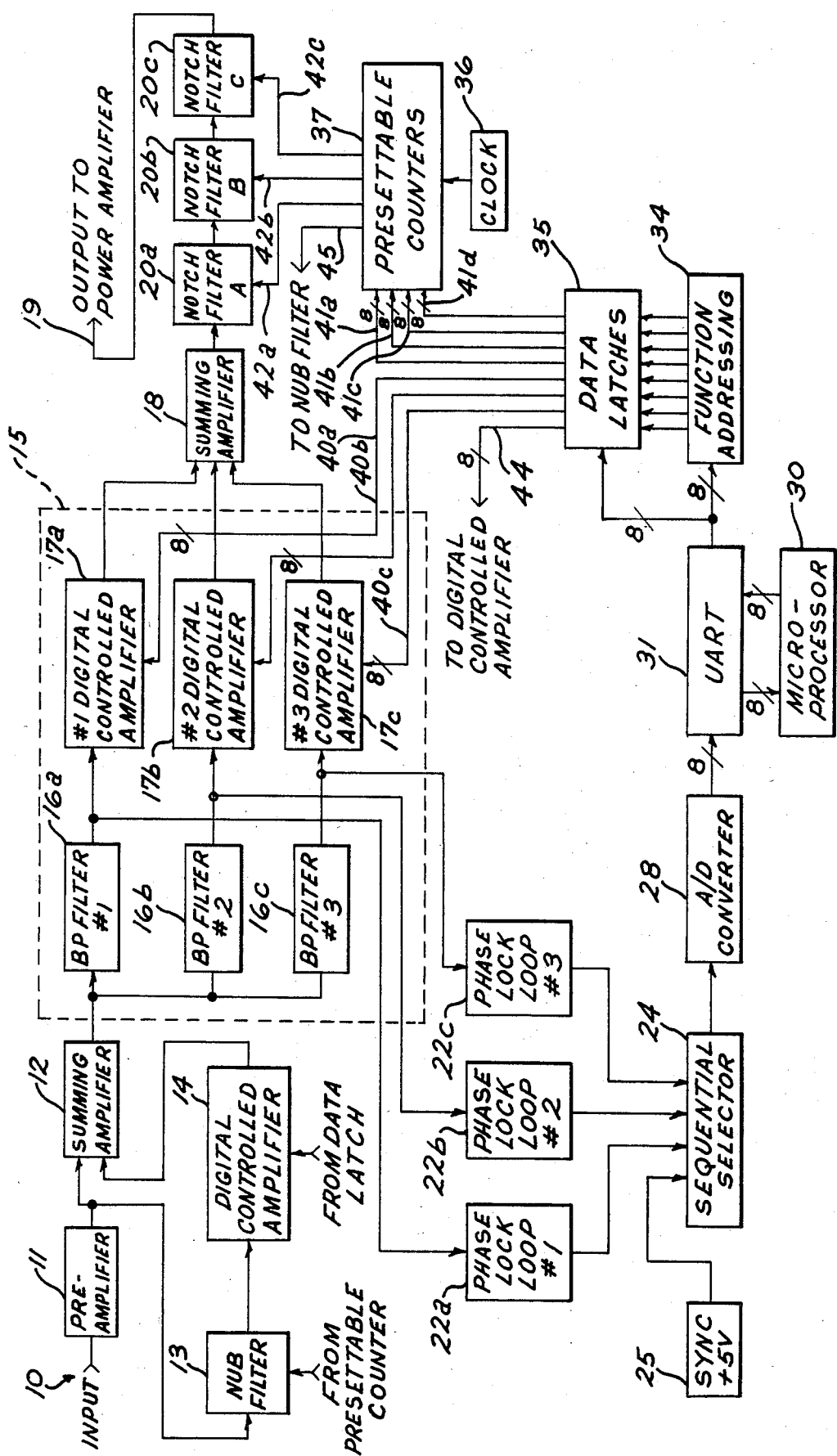
FIG. 1 is a block diagram of the analog signal translating system of the present invention.

Referring to FIG. 1, input means for supplying an input analog signal includes input terminal 10 and an optional preamplifier 11, the output of which is connected to one input leg of summing amplifier 12. The output of preamplifier 11 is also coupled through a narrow band boost or "nub" filter 13 and a digital controlled amplifier 14 to another input leg of summing amplifier 12 for reasons to be discussed subsequently.

Figure 2A:
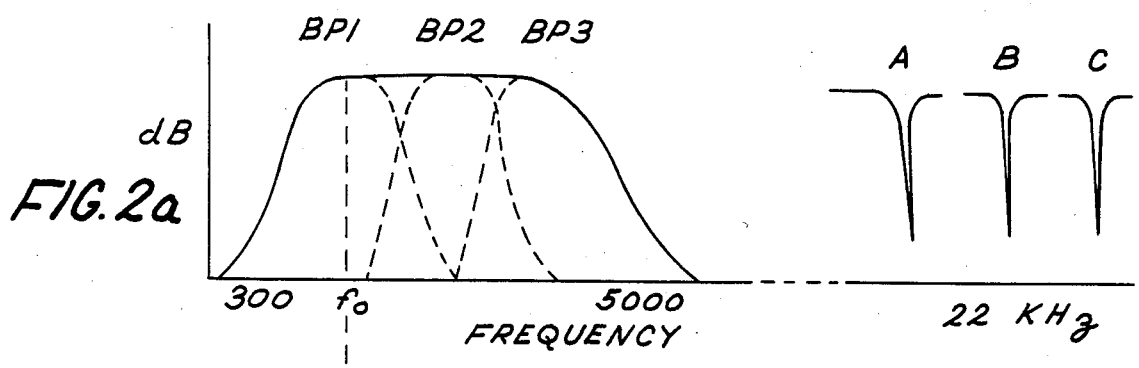
FIGS. 2a and 2b are bandpass characteristics of the signal translating system of the invention illustrating the effect of inserting notch filters on the system bandpass.

The output of summing amplifier 12 is coupled to an anlog signal processing channel 15 which includes a plurality of bandpass filters 16a-16c each coupled in series with one of a corresponding plurality of digital controlled amplifiers 17a-17c. The output of amplifiers 17a-17c are coupled to summing amplifier 18 which comprises output circuit means for supplying the combined bandwidth analog signal from channel 15 to output terminal 19 via narrow band "notch" filters 20a-20c for application to an output utilization circuit, such as a power amplifier. As seen in FIG. 2a, the bandwidth of signal processing channel 15 has a combined bandwidth response of from about 300 Hz to about 5000 Hz. In the illustrative embodiment of FIG. 1, channel 15 includes three individual signal channels whose respective bandwidths make up the combined bandwidth of signal channel 15. It will be appreciated that additional narrow band signal channels may be included in channel 15 although, for purposes of illustration of the invention, three channels are sufficient. If a broader combined bandwidth is used, such as a full audio bandwidth of 20 Hz–20 KHz, additional narrow band filters may be used.

In accordance with a feature of the invention, phase lock loop (PLL) circuits 22a-22c are coupled respectively to the outputs of bandpass filters 16a-16b of signal 15. As is known in the art, a PLL circuit includes a voltage-controlled oscillator (VCO) feeding a summing amplifier and operates as a frequency-to-voltage converter whose output voltage is a function of the difference between the frequency of the input signal and the free-running or rest frequency of the VCO. It is an inherent characteristic of a PLL that it attempts to lock onto, i.e. maintain a constant phase difference with the strongest signal within the detection band of the PLL. With an input signal that is constantly varying in frequency and amplitude, the PLL output varies in a corresponding manner. However, should a strong constant frequency signal, such as an oscillation signal, appear within the detection band of the PLL, the PLL will lock onto the strong signal and generate a constant level output voltage. This feature of a PLL makes the PLL useful for the detection of a potential or actual oscillation signal as will be seen subsequently.

A sequential selector 24 comprises means provided for sampling the output of each of the PLL circuits 22a-22c at a rate of, for example, 1 millisecond per sample for each PLL. A constant amplitude sync level is provided from source 25 during one sample period for purposes of synchronizing subsequent data processing in microprocessor 30. Sync source 25 may, in fact, be a constant level output of one stage of selector 24. Thus, in the system of FIG. 1, the individual circuits in signal processing channel 15 are effectively sampled via the PLL circuits 22a-22c at a rate of 1 millisecond per circuit with 3 milliseconds between each successive sampling of any given PLL.

The analog output samples of PLL circuits 22a-22c are furnished in sequential order, preceded by a sync period of 1 millisecond, to an analog-to-digital converter 28 where the analog voltage levels of the respective samples are converted into digital numeric valued signals suitable for data processing in microprocessor 30. Transmission of the parallel 8 bit words ("bytes") of data from A/D converter 28 is accomplished in known manner by a universal asynchronous receiver/transmitter (UART) 31. UART 31 is employed to receive and transmit digital signals when a physically separate microcomputer is used as the microprocessor 30. In cases where a built-in microprocessor is used, it is not necessary to employ UART 31.

Microprocessor 30 is preprogrammed to receive the PLL sample signals from selector circuit 24 and to compare the numeric values of successive signals in each respective sample slot. When the microprocessor determines, by means of a decrement counter, that a predetermined number of signals of substantially the same numeric value have been received in a given sample slot within a predetermined time period, it determines via the program that a potential oscillation is occurring in the corresponding individual signal channel. By reference to the sync period from the selector circuit 24, the digital signals can be appropriately addressed into the memory with retention of the identity of the bandwidth from which the repeating constant value signal is derived. Also, since the dc amplitude of the PLL is related to the frequency of the signal to which it is locked, this relationship can be stored as a look-up table in memory for the purpose of controlling frequency addressing of notch filters 20a-20c.

Figure 4:
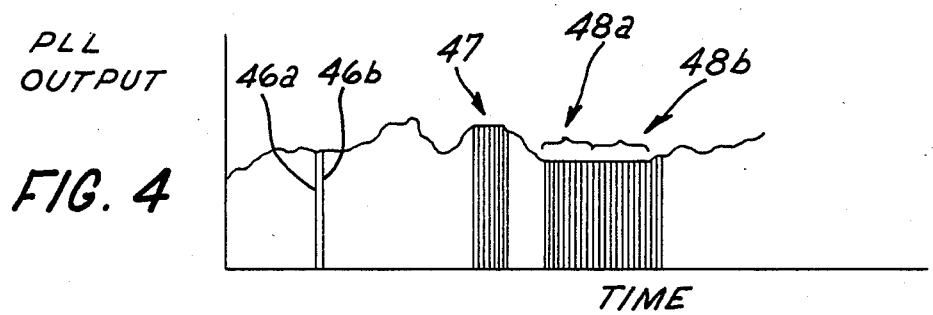
FIG. 4 is a voltage vs. time diagram at the output of one of the phase lock loop (PLL) circuits 22a–22c illustrating the sequential time sampling used in accordance with a feature of the present invention for the detection of the constant value output of the PLL that occurs in the presence of an oscillatory signal.
Figure 5:
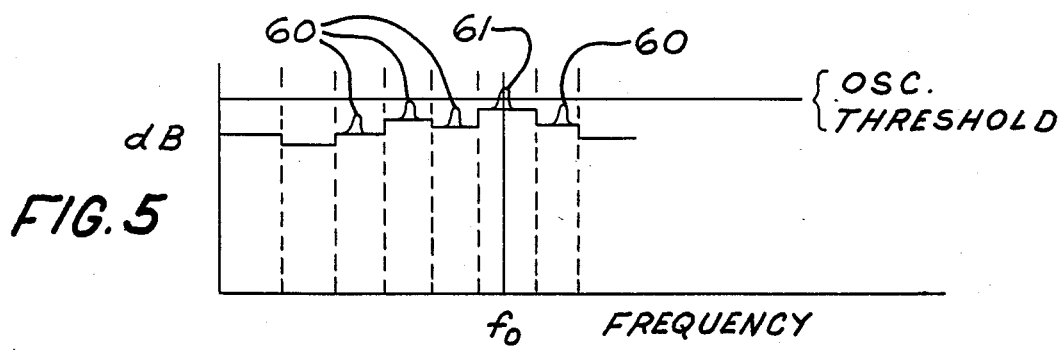
FIG. 5 is a bandpass characteristic curve for the signal translating system with a plurality of bandpass channels showing the use of insertion of signal boost or "nub" to create an artificial incipient oscillation in accordance with another aspect of the invention.

In one form of the invention, the occurrence of a predetermined number of successive digital signals of the same numeric value or nearly the same within ±1 is used to indicate potential oscillation. The exact number of repetitions used to indicate oscillations is a matter of choice. It has been determined that from 5 to 16 repeats give good results with the lower the number used the more sensitive the response becomes. In an actually constructed embodiment, a figure of 8 repetitions proved effective. This feature is best illustrated in FIG. 4 wherein samples 46a and 46b have different amplitudes indicating no strong single frequency signal is present, while samples 47 are of constant amplitude but for only 7 repeats and thus no oscillation potential would be indicated. At 48a and 48b two successive sets of 8 repeats indicates a strong oscillation signal present.

Alternatively, the microprocessor can be programmed to respond to the repetition of the same (or nearly the same within ±1) valued signals that occur a given number of times over an extended time period even though the repetitions are not successive. For example, the occurrence of 64 signals of the same value within a time frame of 264 sampling periods can provide such an indication and the microprocessor can be programmed to respond on a rolling time frame basis. It will be appreciated that the choice of the governing criteria is somewhat related to the statistical correlation between the occurrence of constant valued signals and the potential for indicating the existence of an oscillations contrasted with a single frequency note in the audio signal..

Function addressing circuit 34 and data latch circuits 35 along with the 8 bit data lines 40a–40c comprise means responsive to the output of the microprocessor 30 for attenuating the gain of one or more of the digital controlled amplifiers in signal channel 15. Each time a potential oscillation is detected, the gain of the affected digital controlled amplifier is reduced preferably by a small amount, such as 1.5 db. In this way the amount of attenuation is insufficient to have a noticeable effect on the quality of the analog signal through the channel while at the same time the attenuation has the affect of tending to suppress the potential oscillation.

Figure 2B:
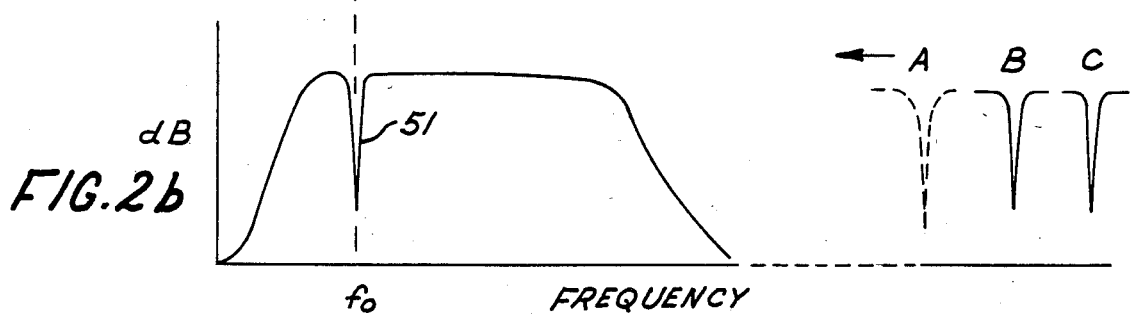
Figure 3:
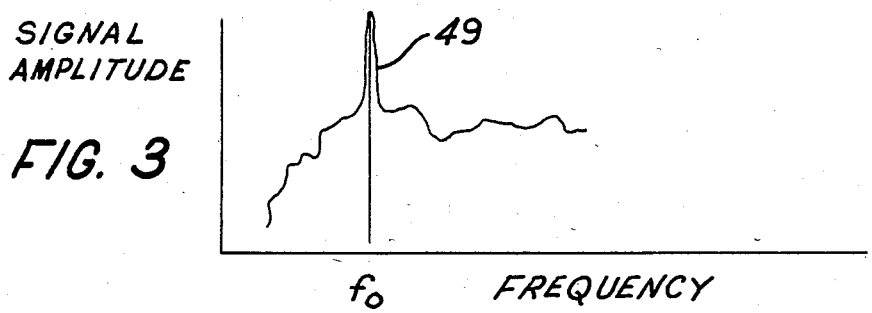
FIG. 3 is a signal energy spectrum of the signal translating system illustrating the effect on signal output of an oscillation that is to be suppressed in accordance with one aspect of the present invention.

If a series of successive gain reductions, i.e. a maximum of 4.5 db in the FIG. 1 embodiment, is insufficient to suppress a particularly strong oscillation, data lines 41a–41d, presettable counters 37 and clock 36 comprise further means for addressing, via lines 42a–42c, the center frequency of notch filters 20a–20c so as to move the narrow reject band of the filters, as needed, to the frequency or frequencies at which the strong oscillation is occurring as shown in FIGS. 2a and 2b. Typically, the notch filters, which may be National Semiconductor MF-10 filters, can be set to a predetermined amount of attenuation, such as 20 db and consequently the notch filter can be particularly effective in suppressing strong oscillation frequencies. When the notch filter is brought into play, the microprocessor is programmed to return the gain of the affected digital control amplifier to its normal equalized gain setting thus assuring minimum disruption of the sound signal passing through the channel involved. Thus, as shown in FIG. 3., the spike 49 caused by the increased signal strength resulting from an oscillation at frequency $f_o$ is attenuated by the notch 51 (FIG. 2b) in the band frequency response.

A frequency address data line is also coupled from the presettable counter circuit 37 to the control input of nub filter 13. Nub filter 13 may also be an MF-10 device and is adapted to provide a narrow band boost as opposed to attenuation. By means of suitable programming of the microprocessor, nub filter 13 can artificially boost the input signal at any selected frequency for the purpose of testing whether a "near oscillation" condition exists. This is useful in conjunction with operation of the system of the invention as an automatic real time bandwidth equalizer both at the beginning of a program and also continuously during use as a program amplification system as changing transient conditions cause changes in the overall sound reinforcement system response.

The operation of the signal translating system of the invention will now be considered with reference to the program flow charts of FIGS. 6–11. Referring to FIG. 6, upon beginning with the MAINLINE program, the microprocessor is initialized at 81 following which the program enters subroutine AUTOEQ, an optional·subroutine which utilizes a feature of the invention to automatically equalize the bandwidth response of the signal channel 15 by establishing preset equalized gain settings for each of the bandpass channels within channel 15.

Upon entering AUTOEQ in FIG. 7, a standard pink noise source is turned on at 90 following which the microprocessor causes the master gain of the channel 15 to be incrementally increased in conventional manner, such as via a digital controlled amplifier (not shown) which can operate at the output of summing amplifier 12. Enquiry 92 determines if a potential oscillation has been created by this action in any of the bandpass circuits in channel 15. As long as there is no oscillation candidate detected, enquiry 92 returns back to instruction 91 to further increase the master gain of the system. When an oscillation candidate is detected, with the pink noise present, the program moves to 93 to decrease the band gain after which enquiry 94 causes the process to repeat until the master gain has been increased to its maximum or until all band gains have been reduced at least once, the latter condition indicating full equalization of the entire system bandpass characteristic.

Reduction of the gain of each channel at least once indicates that the overall band gain is equalized with the just determined default settings. When this occurs, the program moves to restore the master gain to its original operative setting and turn off the pink noise source and then returns to MAINLINE.

Figure 11:
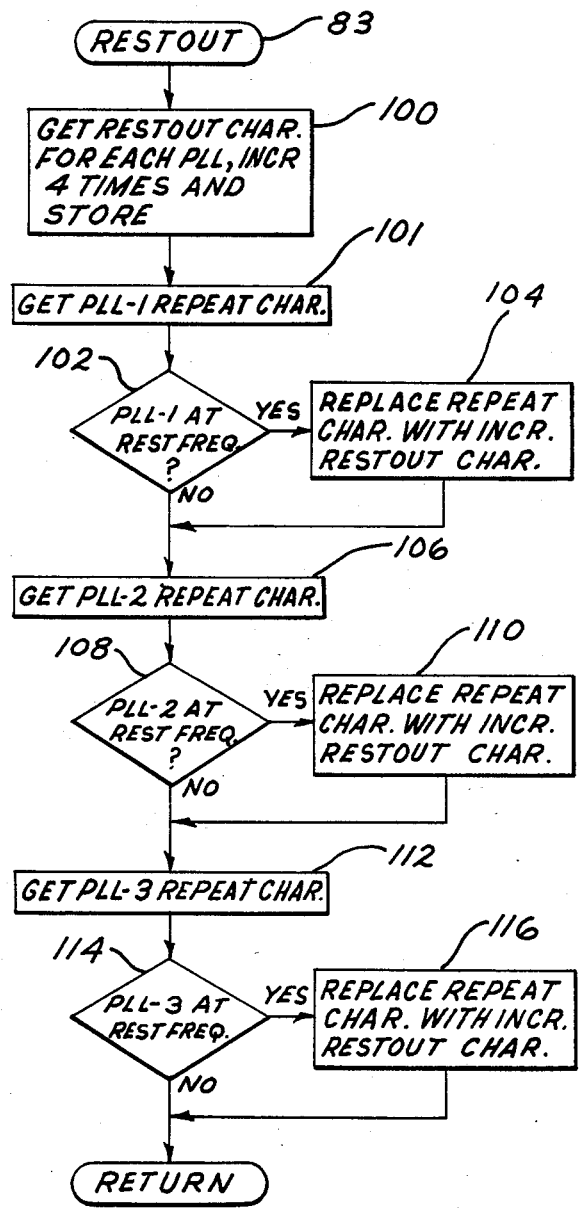
Figure 10:
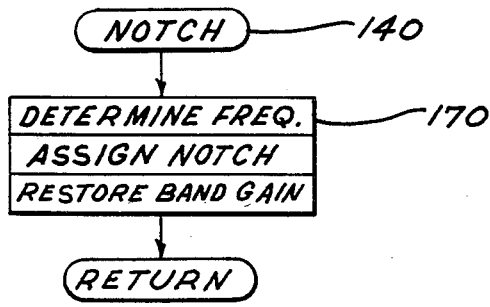

Upon return the program moves to subroutine RESTOUT shown in FIG. 11 to assure that any PLL operating at its rest frequency, to which it reverts in the absence of program signal, is not erroneously interpreted as detecting an oscillation candidate. Instruction 100 determines the numerical value for each PLL's rest frequency ("restout character") and arbitrarily adds an increment of 4 to the character in memory. Instruction 101 then determines the numerical value of the PLL-1 signal sample ("repeat character") currently in existence and, if enquiry 102 determines that it is the repeat character corresponding to the PLL rest frequency, instruction 104 replaces the actual repeat character with the modified restout character. The process is repeated for each PLL in the system and then returns to MAINLINE.

Upon return, the program waits for the arrival of a sync period as determined by sync source 25 following which it enters the first of a repetitive series of PLL subroutines such as shown in FIG. 8. Upon entering the PLL subroutine, instruction 120 loads all data from memory that had been stored from any previous pass through the subroutine for this particular PLL and then enters the GAIN CONTROL subroutine shown in FIG. 9.

Figure 9:
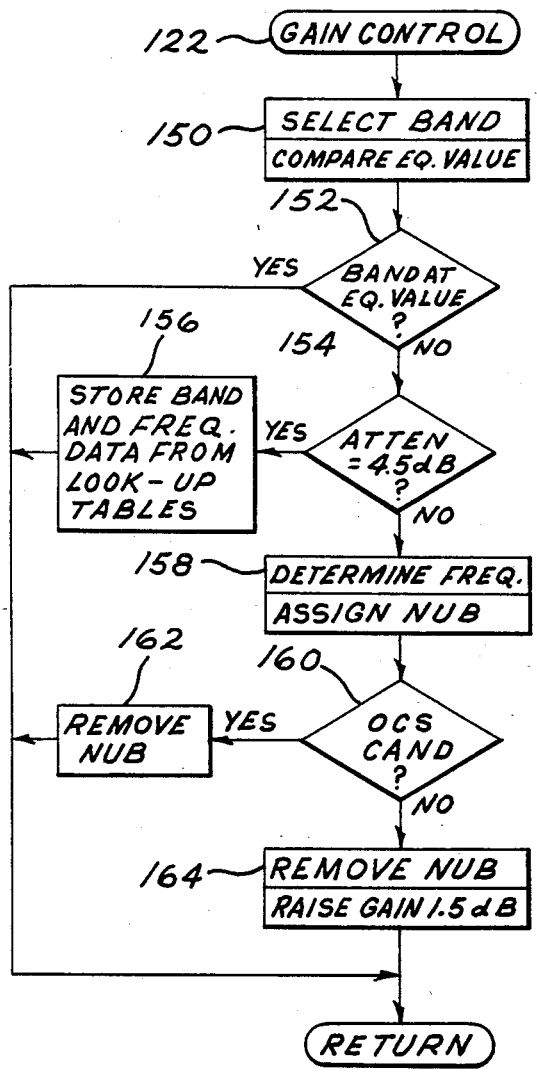

In FIG. 9, instruction 150 gets the existing band gain data from memory and compares it to the normal equalized value.

The normal equalized value may be a manually determined setting, as is done conventionally, or it may be the preset (default) equalized gain settings resulting from the optional use of the AUTOEQ subroutine of FIG. 7. If found to be the same at 152, the subroutine immediately returns to the PLL subroutine of FIG. 8. If found not to be the same, enquiry 154 determines if it is at maximum attenuation, in this example 4.5 db. If so, the band and frequency data is stored in memory for subsequent output to circuits 34 and 35 to cause the presettable counters to address a notch filter to the particular frequency that caused the band attenuation to be driven to its maximum value. If not at maximum attenuation, instruction 158 determines the frequency from the memory look-up table and causes a nub from nub filter 13 to be assigned to the frequency involved. Enquiry 160 then determines if this causes an oscillation candidate to result and, if it does, the nub is removed at 162 and the program returns to the PLL subroutine. If no oscillation candidate is detected, the nub is removed at 164 and the band gain is raised one step of 1.5 db. In this latter way, repetitive passes through this subroutine can result in return of the band gain to normal equalized setting when any transient cause of oscillation is removed.

Upon return to the PLL subroutine, instruction 124 gets the updated repeat character for the PLL circuit (numeric value of the sample signal) and enquiry 126 determines from the previously stored data if this is a repeat of the previous character. If not, instruction 130 exchanges the new PLL character for old in the memory and returns to MAINLINE to repeat the process for the next PLL circuit. If enquiry 126 determines that the new PLL character is a repeat of the previous character a repeat counter (which had been initialized to a count of 8 or some other count depending on the system sensitivity desired, as previously described) is decremented by one. Enquiry 132 determines if the counter has reached zero and if not the subroutine returns to MAINLINE. If it has reached zero, this indicates the existence of an oscillation candidate. Instruction 134 resets the repeat counter and enquiry 136 then determnes if the band gain is at maximum 4.5 db attenuation. If not instruction 138 attenuates the band gain by a further increment of 1.5 db and then returns to MAINLINE. If maximum 4.5 db attenuation exists then the program moves to NOTCH subroutine 140 shown in FIG. 10.

In the NOTCH subroutine, instruction 170 determines the offending frequency from the look-up table, causes a notch to be assigned via data circuits 35 and presettable counters 37 and causes the band gain to be returned to normal equalized value via data latch circuits 35 and the appropriate line 40a–40b.

It will be appreciated from the foregoing description that there has been disclosed an effective, low cost, fast acting oscillation suppressor and automatic equalizer that acts with minimum disruption of the analog signal processing channel.

While in accordance with the patent statutes, there has been described what at present is considered to be preferred embodiments of the invention, it will be obvious to those skilled in the art that various changes and modifications may be made therein without departing from the invention. It is, therefore, intended by the appended claims to cover all such changes and modifications as fall within the true spirit and scope of the invention.

What is claimed is:

1. An analog signal translating system with automatic frequency selective signal gain adjustment comprising:
    input means for supplying an input analog signal;
    an analog signal processing channel coupled to said input means and having a predetermined combined bandwidth, the signal processing channel including a plurality of individual signal channels coupled in parallel to said input means, at least one of the individual signal channels having a bandpass filter and a digital controlled amplifier connected in series, the bandwidth of said individual channel being less than the combined bandwidth of the signal processing channel;
    output circuit means coupled to the individual signal channels for supplying the combined bandwidth analog signal to an output utilization circuit;
    means including a phase lock loop circuit coupled to said one individual signal channel for generating a substantially constant amplitude output signal indicative of the occurrence of a potential oscillation at a frequency within the band of said individual signal channel;
    means for periodically sampling the output of said phase lock loop circuit and converting the amplitude of each sample to a digital multibit numeric value signal;
    preprogrammed microprocessor means coupled to the sampling means to provide, in response to the occurrence of a predetermined number of said digital multibit numeric value signals of substantially constant value within a predetermined time period from the sampling means, a first output indicating the potential presence of an oscillation at a frequency within the bandwidth of said individual signal channel;
    and means responsive to said first output of the microprocessor to attenuate the gain of the digital controlled amplifier in said individual channel by a predetermined amount so as to reduce the potential for oscillation at said frequency within said individual channel.

2. The system of claim 1, in which the microprocessor means is adapted to determine any successive occurrence of sets of predetermined numbers of sequentially recurring ones of said digital numeric signals of substantially constant value from the sampling means and in which the microprocessor responsive means is adapted to attenuate the response of the individual channel by a further predetermined amount in response to the occurrence of a successive set of said constant valued digital numeric signals.

3. The system of claim 2, in which the microprocessor is preprogrammed to determine when said individual channel is at a predetermined maximum attenuation level and in which the output circuit means includes at least one narrow band signal attenuation means having a movable center frequency for attenuating a selectable frequency of the analog signal and in which said means responsive to the microprocessor means is adapted to move the center frequency of the narrow band attenuation means to the frequency of the potential oscillation occurring in the individual signal channel when said individual signal channel is at said maximum predetermined attenuation level.

4. The system of claim 3, in which circuit means, including a frequency selectable narrow band signal boosting circuit, is included in the signal processing channel ahead of the individual signal channels and in which the microprocessor is adapted to selectively insert signal boost from said boosting circuit at frequencies within the combined bandwidth of the signal processing channel to determine the potential for oscillation to occur at said selected frequencies.

5. The system of claim 4, in which said individual signal channel has a predetermined normal equalized setting, and in which the microprocessor is adapted to insert the signal boost at a frequency corresponding to that at which oscillation had previously been detected in said individual signal channel to determine whether the attenuation response of the signal channel can be returned toward said normal equalized setting.

* * * * *